(12) United States Patent
Chen

(10) Patent No.: US 12,710,819 B2
(45) Date of Patent: Aug. 18, 2026

(54) PIEZOELECTRIC SENSOR AND HAPTIC FEEDBACK APPARATUS

(71) Applicants: Beijing BOE Technology Development Co., Ltd., Beijing (CN); BOE Technology Group Co., Ltd., Beijing (CN)

(72) Inventor: Yuju Chen, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 1036 days.

(21) Appl. No.: 17/800,589

(22) PCT Filed: Nov. 25, 2021

(86) PCT No.: PCT/CN2021/133249

§ 371 (c)(1),
(2) Date: Aug. 18, 2022

(87) PCT Pub. No.: WO2022/179219

PCT Pub. Date: Sep. 1, 2022

(65) Prior Publication Data

US 2024/0224809 A1 Jul. 4, 2024

(30) Foreign Application Priority Data

Feb. 26, 2021 (WO) ................ PCT/CN2021/078073

(51) Int. Cl.
*H10N 30/87* (2023.01)
*B06B 1/06* (2006.01)
(Continued)

(52) U.S. Cl.
CPC ............ *G06F 3/016* (2013.01); *B06B 1/0622* (2013.01); *H10N 30/101* (2024.05);
(Continued)

(58) Field of Classification Search
CPC ...... G06F 3/016; H10N 30/88; H10N 30/875; B06B 1/0622
See application file for complete search history.

(56) References Cited

U.S. PATENT DOCUMENTS 6,333,529 B1 12/2001 Ashida et al.
2003/0067449 A1 4/2003 Yoshikawa et al.
(Continued)

FOREIGN PATENT DOCUMENTS

CN 101632054 A 1/2010
CN 103247461 A 8/2013
(Continued)

OTHER PUBLICATIONS

English Translation of JP 2017103952 (Year: 2017).*
(Continued)

*Primary Examiner* — Bryan P Gordon
(74) *Attorney, Agent, or Firm* — ArentFox Schiff LLP; Michael Fainberg

(57) ABSTRACT

Embodiments of the present disclosure provide a piezoelectric sensor and a haptic feedback apparatus. The piezoelectric sensor includes a base substrate; at least one piezoelectric device located on the base substrate; an organic insulation layer located on one side, facing away from the base substrate, of the piezoelectric device; an inorganic insulation layer located on one side, facing away from the base substrate, of the organic insulation layer, and a wiring layer located on one side, facing away from the base substrate, of the inorganic insulation layer.

20 Claims, 11 Drawing Sheets

(51) Int. Cl.

| | |
|---|---|
| ***G06F 3/01*** | (2006.01) |
| ***H10N 30/00*** | (2023.01) |
| ***H10N 30/88*** | (2023.01) |
| *G08B 6/00* | (2006.01) |

(52) U.S. Cl.
CPC ........... *H10N 30/875* (2023.02); *H10N 30/88* (2023.02); *G08B 6/00* (2013.01)

(56) References Cited

U.S. PATENT DOCUMENTS

| | | | | |
|---|---|---|---|---|
| 2005/0074973 | A1* | 4/2005 | Ouchi | B82Y 35/00 438/689 |
| 2010/0231657 | A1 | 9/2010 | Takahashi | |
| 2011/0043477 | A1 | 2/2011 | Park et al. | |
| 2013/0199911 | A1 | 8/2013 | Sato et al. | |
| 2013/0241353 | A1 | 9/2013 | Asari | |
| 2015/0040664 | A1 | 2/2015 | Ishii | |
| 2015/0187347 | A1 | 7/2015 | Kojima et al. | |
| 2017/0092838 | A1* | 3/2017 | Konishi | H02N 2/0085 |
| 2018/0150164 | A1 | 5/2018 | Naganuma | |
| 2019/0079584 | A1* | 3/2019 | Bonanno | G06F 3/03543 |
| 2019/0363241 | A1 | 11/2019 | Huang | |

FOREIGN PATENT DOCUMENTS

| | | | |
|---|---|---|---|
| CN | 103308040 | A | 9/2013 |
| CN | 104348444 | A | 2/2015 |
| CN | 107017334 | A | 8/2017 |
| CN | 108846318 | A | 11/2018 |
| CN | 109240485 | A | 1/2019 |
| CN | 210575960 | U | 5/2020 |
| CN | 111749874 | A | 10/2020 |
| CN | 111769080 | A | 10/2020 |
| EP | 0567878 | A1 | 11/1993 |
| JP | 0246911 | A | 2/1990 |
| JP | H03-237745 | A | 10/1991 |
| JP | 2000015809 | A | 1/2000 |
| JP | 2014197576 | A | 10/2014 |
| JP | 2017103952 | A | 6/2017 |
| WO | 2020/108017 | A1 | 6/2020 |

OTHER PUBLICATIONS

Office Action received for Chinese Patent Application No. 202180003572.3, mailed on Dec. 27, 2024, 25 pages (16 pages of English Translation and 9 pages of Original Document).

Extended European Search Report for 21927643.3 issued on Jan. 23, 2024.

Office Action for corresponding U.S. Appl. No. 17/620,538 issued on Jun. 7, 2023.

* cited by examiner

PIEZOELECTRIC SENSOR AND HAPTIC FEEDBACK APPARATUS

CROSS REFERENCE TO RELATED APPLICATION

The present application is a US National Stage of International Application No. PCT/CN2021/133249, filed on Nov. 25, 2021, which claims the priority to the PCT application No. PCT/CN2021/078073, filed to the Chinese Patent Office on Feb. 26, 2021 and entitled "Haptic feedback Substrate, Haptic feedback Apparatus and Haptic feedback Method", which is incorporated herein in its entirety by reference.

FIELD

The present disclosure relates to the field of sensors, in particular to a piezoelectric sensor and a haptic feedback apparatus.

BACKGROUND

As a focus of current scientific and technological development, haptic feedback allows a user to interact with a terminal by using a sense of touch in the form of vibration feedback or tactile representation.

With the properties of objects perceived by touching screens with bare fingers, surface tactile representation technology achieves efficient and natural interaction at multimedia terminals, thereby gaining extensive attention from researchers at home and abroad for its immense research value. Physically, the surface tactile technology employs action between the surface roughness of the objects and the surface of the skin (fingertips), and forms different friction force due to variable surface structures. Therefore, different touch/tactile sense can be simulated by controlling the surface friction.

SUMMARY

Embodiments of the present disclosure provide a piezoelectric sensor and a haptic feedback apparatus. A specific solution is described as follows.

An piezoelectric sensor provided by the embodiment of the present disclosure includes: a base substrate; at least one piezoelectric device located on the base substrate; an organic insulation layer located on one side, facing away from the base substrate, of the piezoelectric device; where the organic insulation layer is provided with a first via hole, and an orthographic projection, on the base substrate, of the first via hole overlaps an orthographic projection, on the base substrate, of the piezoelectric device; an inorganic insulation layer located on one side, facing away from the base substrate, of the organic insulation layer; where the inorganic insulation layer does not overlap at least a portion of the first via hole; and a wiring layer located on one side, facing away from the base substrate, of the inorganic insulation layer; where the wiring layer includes a wire, one end of the wire being electrically connected to the piezoelectric device by means of at least the portion of the first via hole.

In a possible implementation, in the above piezoelectric sensor provided by the embodiment of the present disclosure, the piezoelectric device includes: a first electrode between the base substrate and the organic insulation layer, a piezoelectric layer between the first electrode and the organic insulation layer, and a second electrode between the piezoelectric layer and the organic insulation layer; where the inorganic insulation layer covers a side wall of the first via hole and extends to make contact with the second electrode.

In a possible implementation, in the above piezoelectric sensor provided by the embodiment of the present disclosure, at the same side wall of the first via hole, a contact boundary between the inorganic insulation layer and the second electrode is a first boundary, a contact boundary between the organic insulation layer and the second electrode is a second boundary, and a distance between the first boundary and the second boundary is greater than 30% and less than 60% of a thickness of the piezoelectric layer.

In a possible implementation, in the above piezoelectric sensor provided by the embodiment of the present disclosure, the piezoelectric device includes: a first electrode between the base substrate and the organic insulation layer, a piezoelectric layer between the first electrode and the organic insulation layer, and a second electrode between the piezoelectric layer and the organic insulation layer; where the inorganic insulation layer covers a side wall of the first via hole and the second electrode exposed out of the first via hole, a portion, covering the second electrode, of the inorganic insulation layer is provided with at least one second via hole, and the wiring layer is electrically connected to the second electrode by means of the first via hole and the second via hole.

In a possible implementation, in the above piezoelectric sensor provided by the embodiment of the present disclosure, the piezoelectric sensor further includes: a binding electrode arranged on the same layer as the first electrode, where the binding electrode is arranged near an edge of the base substrate, the binding electrode is configured to be connected to a drive voltage input end, and a voltage signal input from the drive voltage input end is an alternating voltage signal; the other end of the wire is electrically connected to the binding electrode by means of a third via hole provided on the inorganic insulation layer and the organic insulation layer; and the piezoelectric sensor further includes: a lead electrode arranged on the same layer as the first electrode, where the lead electrode is electrically connected to the first electrode, the lead electrode is configured to be connected to an earth voltage input end, and a voltage signal input from the earth voltage input end is an earth voltage signal.

In a possible implementation, in the above piezoelectric sensor provided by the embodiment of the present disclosure, the number of the piezoelectric devices is multiple, the plurality of piezoelectric devices are arrayed on one side of the base substrate, first electrodes of the piezoelectric devices in the same column are in communication with one another, and second electrodes of the piezoelectric devices in the same column are all connected to the same wire of the wiring layer.

In a possible implementation, in the above piezoelectric sensor provided by the embodiment of the present disclosure, the number of the inorganic insulation layer is one.

In a possible implementation, in the above piezoelectric sensor provided by the embodiment of the present disclosure, a material of the inorganic insulation layer is made of one of $SiO_2$, $Al_2O_3$ and $Si_3N_4$.

In a possible implementation, in the above piezoelectric sensor provided by the embodiment of the present disclosure, the inorganic insulation layer includes at least two sub-layers that are stacked, and the two sub-layers are made of different materials.

In a possible implementation, in the above piezoelectric sensor provided by the embodiment of the present disclosure, materials of the sub-layers are made of one of $SiO_2$, $Al_2O_3$ and $Si_3N_4$.

In a possible implementation, in the above piezoelectric sensor provided by the embodiment of the present disclosure, the wiring layer is in a grid structure in shape, and a material of the wiring layer is made of one of Ti/Ni/Au, Ti/Au and Ti/Al/Ti.

In a possible implementation, in the above piezoelectric sensor provided by the embodiment of the present disclosure, the inorganic insulation layer has a thickness of 100 nm-300 nm.

In a possible implementation, in the above piezoelectric sensor provided by the embodiment of the present disclosure, the piezoelectric layer has a thickness of 500 nm-2000 nm.

In a possible implementation, in the above piezoelectric sensor provided by the embodiment of the present disclosure, the piezoelectric layer includes at least one of lead zirconate titanate, aluminum nitride, zinc oxide, barium titanate, lead titanate, potassium niobate, lithium niobate, lithium tantalate and lanthanum gallium silicate.

Accordingly, the embodiment of the present disclosure further provides a haptic feedback apparatus, including the piezoelectric sensor according to any one described above provided by the embodiment of the present disclosure.

DETAILED DESCRIPTION OF THE EMBODIMENTS

Figure 1:
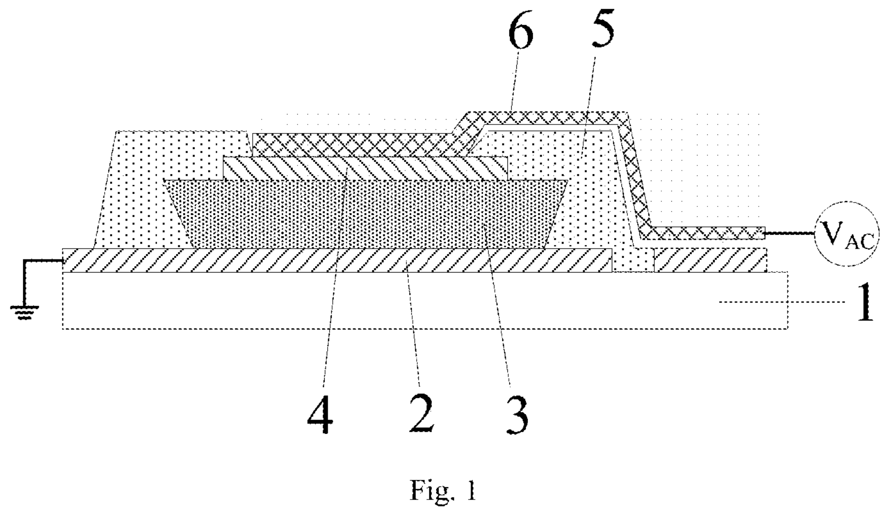
FIG. 1 is a structural schematic diagram of a piezoelectric sensor provided in the related art.

In order to make objectives, technical solutions and advantages of embodiments of the present disclosure clearer, the technical solutions of the embodiment of the present disclosure will be clearly and completely described with reference to the accompanying drawings of the embodiment of the present disclosure. Apparently, the described embodiments are some rather than all of the embodiments of the present disclosure. Moreover, the embodiments in the present disclosure and features in the embodiments may be combined mutually if there is no conflict. All other embodiments obtained by a person of ordinary skill in the art based on the described embodiments of the present disclosure without creative efforts shall fall within the protection scope of the present disclosure.

Unless otherwise defined, technical terms or scientific terms used in the present disclosure should have ordinary meanings understood by those with ordinary skills in the field to which the present disclosure belongs. As used in the present disclosure, “comprise”, “include” and similar words mean that elements or objects appearing before the word cover elements or objects listed after the word and their equivalents, but do not exclude other elements or objects. “Connected”, “connection” and similar words are not limited to physical or mechanical connections, but may include electrical connections, whether direct or indirect. Words such as “inside”, “outside”, “up” and “down” are merely used to express the relative positional relation. When the absolute position of the described object changes, the relative positional relation may also change accordingly.

It should be noted that the size and shape of each figure in the accompanying drawings do not reflect true scales, and are merely to illustrate contents of the present disclosure. Throughout the accompanying drawings, identical or similar reference numerals denote identical or similar elements or elements having identical or similar functions.

Figure 2:
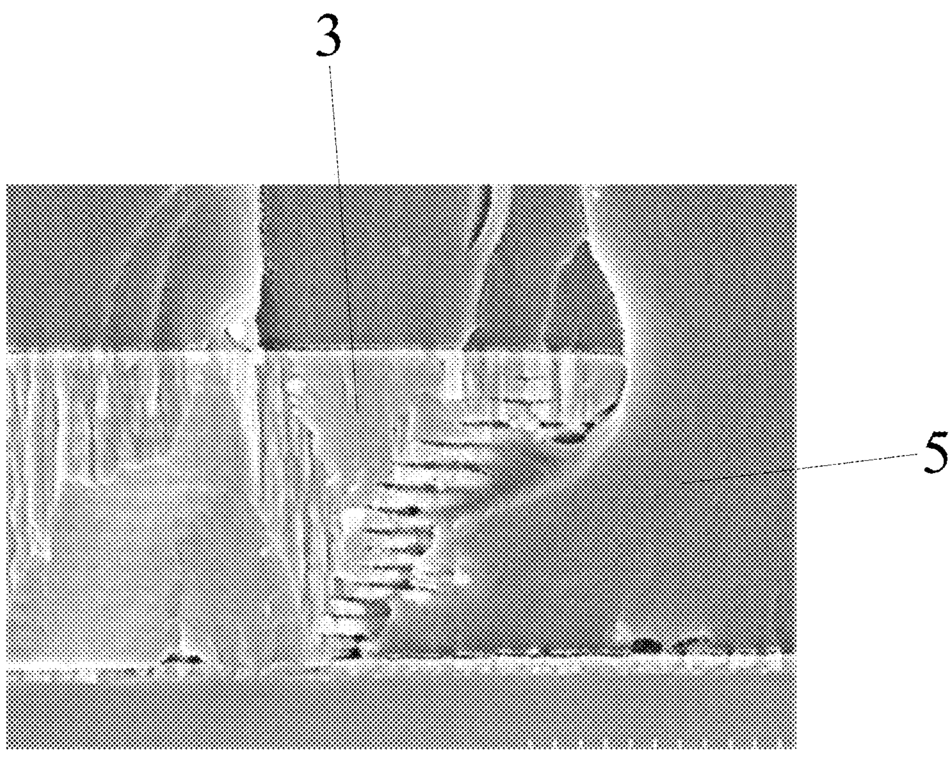
FIG. 2 is a schematic scanning electron microscope image of a piezoelectric layer and an organic insulation layer in FIG. 1.
Figure 3:
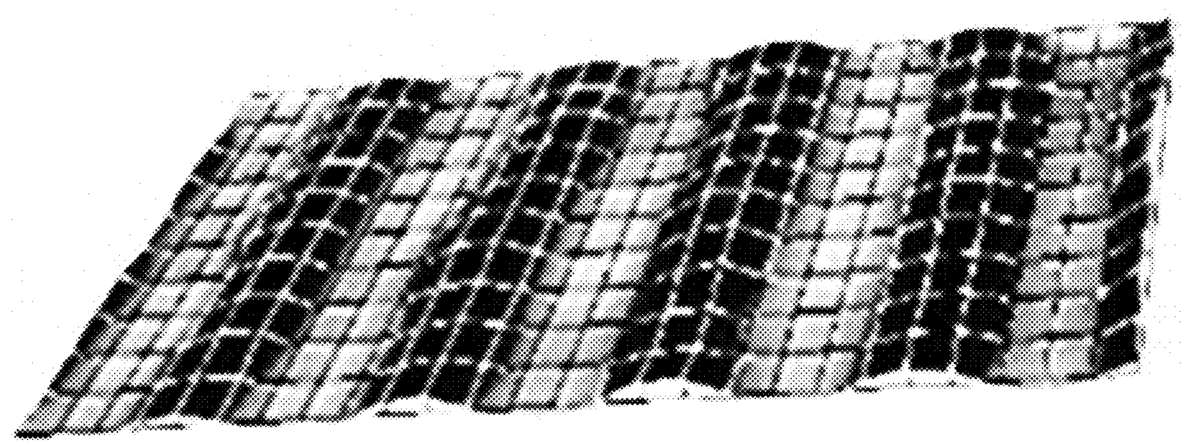
FIG. 3 is a schematic diagram of vibration effect of a piezoelectric sensor.

Film piezoelectric materials feature a high dielectric constant and transparency, thereby being extremely suitable for a vibrator structure integrating screens. Lead zirconate titanate piezoelectric ceramics (PZT) is widely used at present on account of its excellent piezoelectric properties. In the related art, as shown in FIG. 1, a structure of a PZT piezoelectric sensor is provided, the piezoelectric sensor includes a base substrate 1 and a bottom electrode 2, a piezoelectric layer 3, a top electrode 4, an insulation layer 5, and a wiring layer 6 that are sequentially stacked on the base substrate 1. The wiring layer 6 is electrically connected to the top electrode 4 by a via hole penetrating through the insulation layer 5, and the insulation layer 5 is made of an inorganic material. In order to avoid a short circuit, the insulation layer 5 is required to be arranged between the top electrode 4 and the wiring layer 6 for insulation. However, in the process of manufacturing the piezoelectric layer 3 (PZT), especially when a thick film PZT is manufactured by wet etching, a chamfer structure is extremely likely to be formed on the piezoelectric layer 3. Therefore, in the related art, the insulation layer 5 in FIG. 1 is made of organic insulating materials, and a chamfer of the piezoelectric layer 3 may be filled with the organic insulation layer 5. As shown in FIG. 2, a scanning electron microscope (SEM) test structure of the piezoelectric layer 3 and the organic insulation layer 5 is provided, it may be seen that the chamfer of the piezoelectric layer 3 is filled with the organic insulation layer 5. However, using the organic insulation layer 5 leads to the following two problems: (1) the wiring layer 6 is generally made of metal, and adhesion between the metal and the organic material is poor, and peeling between the wiring layer 6 and the organic insulation layer 5 is extremely prone to occur; (2) since the piezoelectric sensor is mainly used for high-frequency vibration excitation, the bottom electrode 2 is earthed under the action of the reverse piezoelectric effect, and a high-frequency alternating voltage signal ($V_{AC}$) is applied to the top electrode 4, so as to apply the high-frequency alternating voltage signal to the piezoelectric layer 3, and high-frequency vibration is generated as a result. As shown in FIG. 3 showing a schematic diagram of a vibration effect of a piezoelectric sensor, after the piezoelectric sensor vibrates, with increase in a drive voltage, an amplitude increases, and risk of peeling in the wiring layer 6 increases accordingly. Since the wiring layer 6 has no mechanical strength, once the wiring layer 6 is subjected to peeling, the wiring layer is likely to burn out and generate high heat under the voltage drive, thus damaging properties of the piezoelectric sensor.

Figure 4:
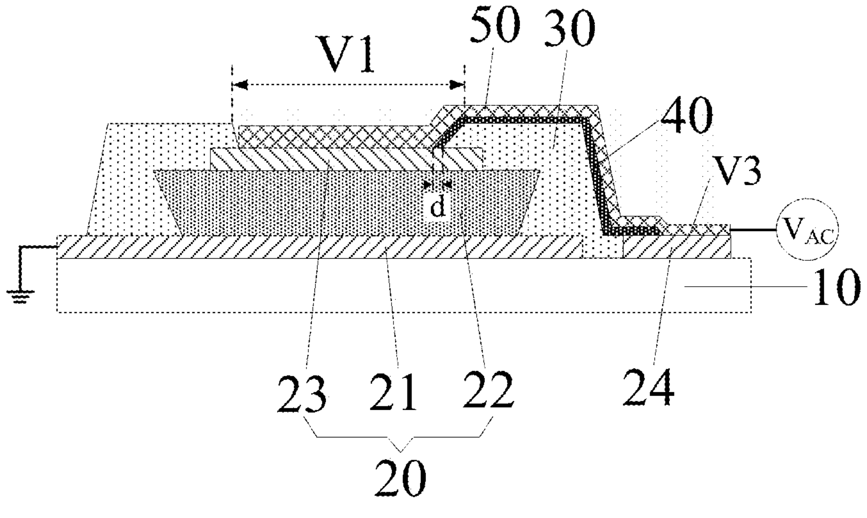
FIG. 4 is a structural schematic diagram of a piezoelectric sensor provided by an embodiment of the present disclosure.
Figure 5:
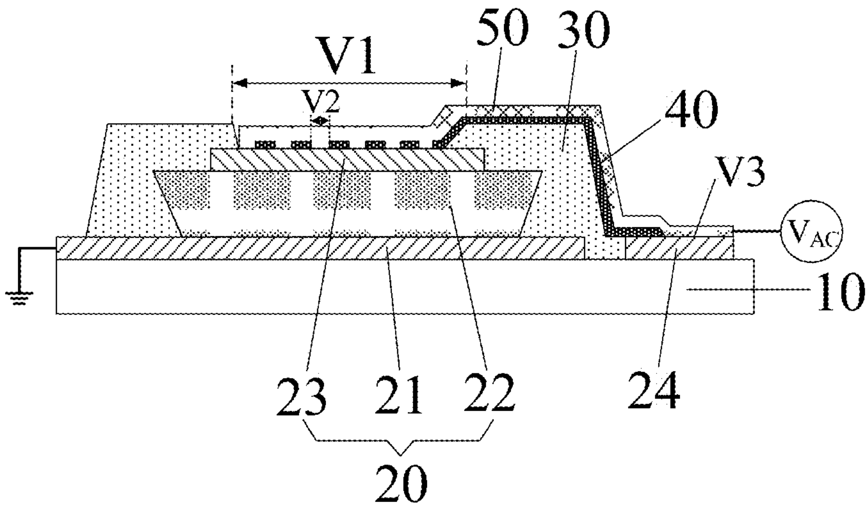
FIG. 5 is a structural schematic diagram of another piezoelectric sensor provided by an embodiment of the present disclosure.

In view of this, an embodiment of the present disclosure provides a piezoelectric sensor, as shown in FIG. 4 and FIG. 5.

The piezoelectric sensor includes: a base substrate 10; at least one piezoelectric device 20 located on the base substrate 10, with one piezoelectric device 20 as an example in FIG. 4 and FIG. 5; an organic insulation layer 30 located on one side, facing away from the base substrate 10, of the piezoelectric device 20; where the organic insulation layer 30 is provided with a first via hole V1, and an orthographic projection, on the base substrate 10, of the first via hole V1 overlaps an orthographic projection, on the base substrate 10, of the piezoelectric device 20; an inorganic insulation layer 40 located on one side, facing away from the base substrate 10, of the organic insulation layer 30; where the inorganic insulation layer 40 does not overlap at least a portion of the first via hole V1; and a wiring layer 50 located on one side, facing away from the base substrate 10, of the inorganic insulation layer 40; where the wiring layer 50 includes a wire, one end of the wire being electrically connected to the piezoelectric device 20 by means of at least the portion of the first via hole V1.

According to the piezoelectric sensor provided by the embodiment of the present disclosure, the inorganic insulation layer 40 is arranged between the wiring layer 50 and the organic insulation layer 30. Since adhesion between the inorganic insulation layer 40 and the wiring layer 50 is strong, the inorganic insulation layer 40 may solve the problem of poor adhesion between the organic insulation layer 30 and the wiring layer 50 on the basis that the organic insulation layer 30 solves the problem of a chamfer of the piezoelectric layer (to be described below) of the piezoelectric device 20, thereby preventing the wiring layer 50 from peeling and further preventing the wiring layer 50 from burning out or generating high heat under the voltage drive.

During a specific implementation, the base substrate may be a base substrate made of glass, silicon or silica ($SiO_2$), sapphire or metal wafers, which is not limited herein. Those skilled in the art may configure the base substrate according to actual application requirements.

During a specific implementation, in the above piezoelectric sensor provided by the embodiment of the present disclosure, as shown in FIG. 4 and FIG. 5, the piezoelectric device 20 includes: a first electrode 21 between the base substrate 10 and the organic insulation layer 30, a piezoelectric layer 22 between the first electrode 21 and the organic insulation layer 30, and a second electrode 23 between the piezoelectric layer 22 and the organic insulation layer 30.

During a specific implementation, in the above piezoelectric sensor provided by the embodiment of the present disclosure, as shown in FIG. 4, the inorganic insulation layer 40 covers a side wall of the first via hole V1 and extends to make contact with the second electrode 23. Due to influence of a manufacturing process, a section of the first via hole V1 in a thickness direction of the piezoelectric sensor is generally an inverted trapezoidal structure. The inorganic insulation layer 40 is arranged to cover the side wall of the first via hole V1 and extends to make contact with the second electrode 23, such that the inorganic insulation layer 40 has a buffering effect in the first via hole V1, and the wiring layer 50 manufactured later may not be broken at the first via hole V1.

During a specific implementation, in the above piezoelectric sensor provided by the embodiment of the present disclosure, as shown in FIG. 4, at the same side wall of the first via hole V1, a contact boundary between the inorganic insulation layer 40 and the second electrode 23 is a first boundary B1, and a contact boundary between the organic insulation layer 30 and the second electrode 23 is a second boundary B2, and a distance d between the first boundary B1 and the second boundary B2 may be greater than 30% of a thickness of the piezoelectric layer 22 and less than 60% of the thickness of the piezoelectric layer 22. Specifically, the piezoelectric layer 22 generally has a thickness of 500 nm-2000 nm, for example, 500 nm, 600 nm, 700 nm, 800 nm, 900 nm, 1000 nm, 1100 nm, 1200 nm, 1300 nm, 1400 nm, 1500 nm, 1600 nm, 1700 nm, 1800 nm, 1900 nm or 2000 nm. For example, if the piezoelectric layer 22 has a thickness of 600 nm, d is greater than 180 nm and less than 360 nm. If the piezoelectric layer 22 has a thickness of 900 mm, d is greater than 270 nm and less than 540 nm. If the piezoelectric layer 22 has a thickness of 1500 nm, d is greater than 450 nm and less than 900 nm.

During a specific implementation, since the wiring layer is generally made of metal, and the second electrode is generally made of indium tin oxide (ITO), adhesion between metal and ITO is poor. In order to prevent the condition that peeling occurs between the wiring layer and the second electrode and causes a failure to transmit electrical signals. In the above piezoelectric sensor provided by the embodiment of the present disclosure, as shown in FIG. 5, the inorganic insulation layer 40 covers the side wall of the first via hole V1 and the second electrode 23 exposed out of the first via hole V1. The portion, covering the second electrode 23, of the inorganic insulation layer 40 is provided with at least one second via hole V2, and the wiring layer 50 is electrically connected to the second electrode 23 by means of the first via hole V1 and the second via hole V2. In this way, a portion between the wiring layer 50 and the exposed second electrode 23 makes contact with the inorganic insulation layer 40, and another portion is electrically connected to the second electrode 23 by means of the first via hole V1 and the second via hole V2. Since the adhesion between the wiring layer 50 and the inorganic insulation layer 40 is strong, adhesion between the wiring layer 50 and the second electrode 23 may be improved while the wiring layer 50 is guaranteed to be electrically connected to the second electrode 23.

Figure 6A:
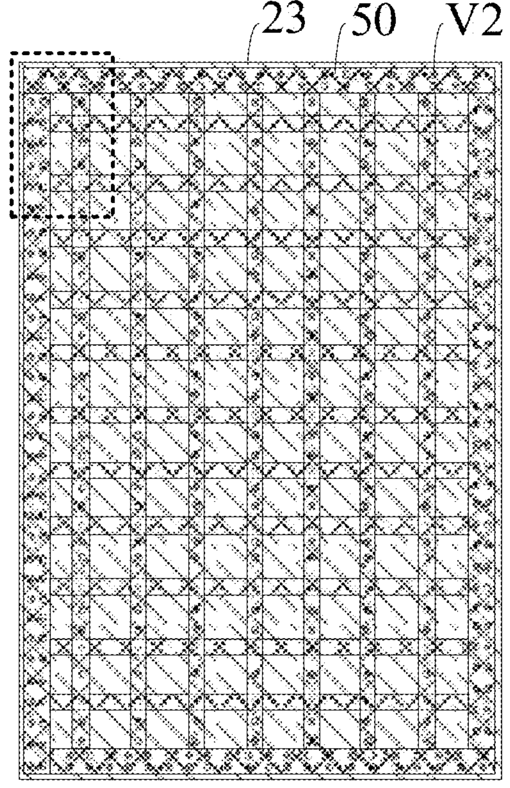
FIG. 6A is a schematic diagram of a top view of a partial film layer in a piezoelectric device.
Figure 6B:
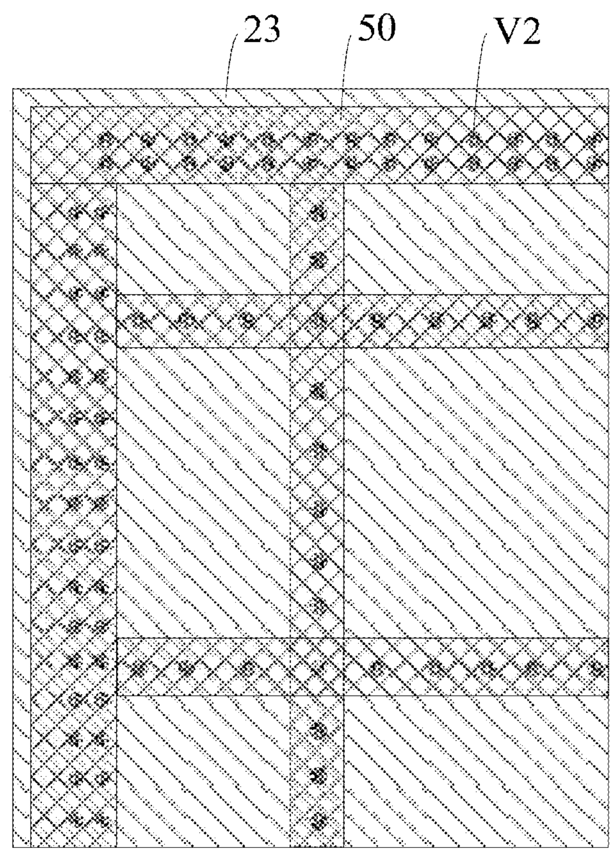
FIG. 6B is an enlarged schematic diagram of a portion in FIG. 6A.

During a specific implementation, in order to more clearly illustrate electrical connection of the wiring layer 50 in FIG. 5 to the second electrode 23 by means of the second via hole V2, as shown in FIG. 6A and FIG. 6B, FIG. 6A being a schematic diagram of a top view of a second electrode 23, a second via hole V2 and a wiring layer 50, and FIG. 6B being an enlarged schematic diagram of a dotted box in FIG. 6A, generally, a piezoelectric sensor is combined with a display device to achieve tactile representation. In order to improve a transmittance of the piezoelectric sensor, the wiring layer 50 may have a grid structure in shape, and the inorganic insulation layer 40 below may be provided with a plurality of second via holes V2 corresponding to grid lines of the grid structure, such that the wiring layer 50 is electrically connected to the second electrode 23 by means of the second via holes V2.

It should be noted that a plurality of patterned first electrodes may be arranged, or the first electrodes may be in a whole-surface structure. A plurality of patterned second electrodes may be arranged.

During a specific implementation, the first electrode and the second electrode may be made of indium tin oxide (ITO), indium zinc oxide (IZO), or one of titanium aurum (Ti—Au) alloy, titanium aluminum titanium (Ti—Al—Ti) alloy, titanium molybdenum (Ti—Mo) alloy, or one of titanium (Ti), aurum (Au), silver (Ag), molybdenum (Mo), copper (Cu), tungsten (W) and chromium (Cr). Those skilled in the art may configure the first electrode and second electrode according to the actual application needs, which is not limited herein.

During a specific implementation, a piezoelectric layer may be made of at least one of lead zirconate titanate ($Pb(Zr,Ti)O_3$, PZT), aluminum nitride (AlN), zinc oxide (ZnO), barium titanate ($BaTiO_3$), lead titanate ($PbTiO_3$), potassium niobate ($KNbO_3$), lithium niobate ($LiNbO_3$), lithium tantalate ($LiTaO_3$) and lanthanum gallium silicate ($La_3Ga_5SiO_{14}$). Specifically, those skilled in the art may select materials for manufacturing the piezoelectric layer according to the actual use needs, which is not limited herein. When PZT is used to manufacture the piezoelectric layer, PZT has a high voltage coefficient, which guarantees piezoelectric properties of the corresponding piezoelectric sensor, and the corresponding piezoelectric sensor may be applied to the haptic feedback apparatus. Moreover, PZT has a high light transmittance, which may not affect display quality of the display device when integrated into the display device.

During a specific implementation, in the above piezoelectric sensor provided by the embodiment of the present disclosure, as shown in FIG. 4 and FIG. 5, the number of the inorganic insulation layer 40 may be one. Specifically, materials of the inorganic insulation layer 40 may include, but are not limited to, one of $SiO_2$, $Al_2O_3$ and $Si_3N_4$.

Figure 7:
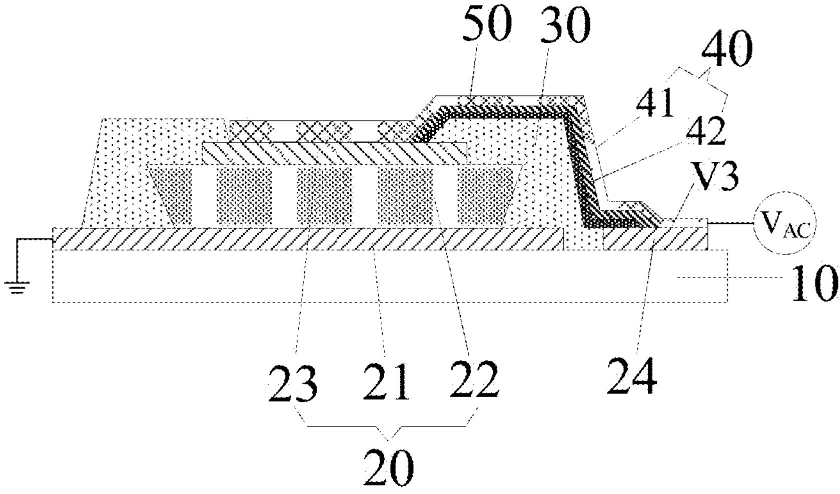
FIG. 7 is a structural schematic diagram of another piezoelectric sensor provided by an embodiment of the present disclosure.
Figure 8:
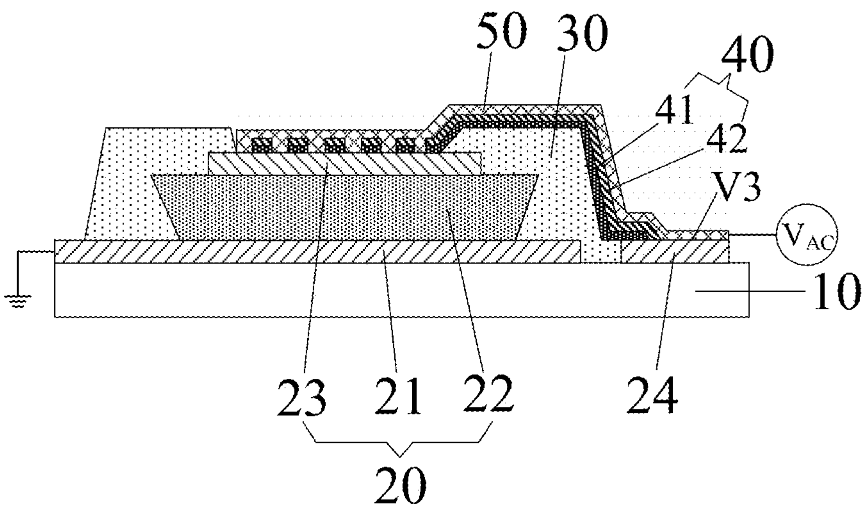
FIG. 8 is a structural schematic diagram of another piezoelectric sensor provided by an embodiment of the present disclosure.

During a specific implementation, in the above piezoelectric sensor provided by the embodiment of the present disclosure, as shown in FIG. 7 and FIG. 8, an inorganic insulation layer 40 may include at least two sub-layers (with two sub-layers 41 and 42 as an example) stacked, and the two sub-layers (41 and 42) are made of different materials. In this way, according to a material of a wiring layer 50, the outermost sub-layer 42 may be made of a material with desirable adhesion to the wiring layer 50. Specifically, materials of the sub-layers (41 and 42) may include, but are not limited to, one of $SiO_2$, $Al_2O_3$ and $Si_3N_4$. For example, if the wiring layer 50 is made of Cr, the outermost sub-layer 42 may be made of $Si_3N_4$.

Specifically, FIG. 7 is different from FIG. 4 in that the number of inorganic insulation layer 40 is different, and the remaining structures are identical to those in FIG. 4. FIG. 8 is different from FIG. 5 in that the number of inorganic insulation layer 40 is different, and the remaining structures are identical to those in FIG. 5, and reference may be made to FIG. 4 and FIG. 5 for specific structure description of FIG. 7 and FIG. 8.

Figure 9:
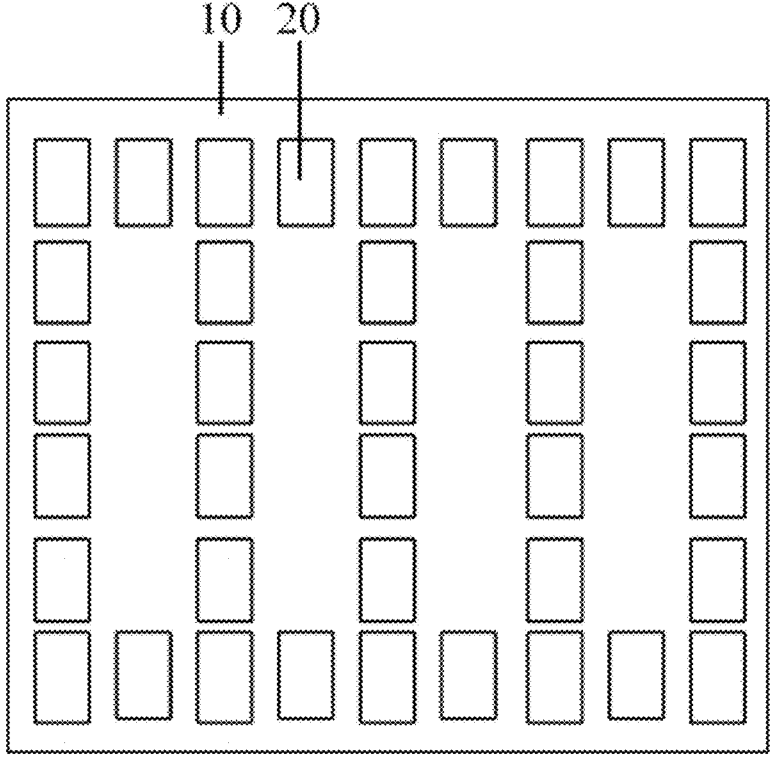
FIG. 9 is a schematic diagram of a planar structure of a piezoelectric sensor provided by an embodiment of the present disclosure.

During a specific implementation, in the above piezoelectric sensor provided by the embodiment of the present disclosure, as shown in FIG. 9, the number of the piezoelectric devices 20 may be multiple, and the plurality of piezoelectric devices 20 are arrayed on one side of a base substrate 10. When the number of the piezoelectric devices 20 may be multiple, each piezoelectric device 20 may be driven independently, or the piezoelectric devices 20 in the same column may be driven in a whole column (column drive), or all piezoelectric devices 20 may be driven as a whole. In this embodiment, the specific manner for driving the plurality of piezoelectric devices 20 is not limited. A specific structure of column drive will be described in detail in the following embodiments.

The plurality of piezoelectric devices 20 shown in FIG. 9 are arranged on the base substrate 10 in an axisymmetric manner. The base substrate 10 is provided with nine columns of piezoelectric devices 20. The number of the piezoelectric devices 20 is six in each odd-numbered column, the number of the piezoelectric devices 20 is two in each even-numbered column, and the piezoelectric devices are located in a first row and a last row of the even-numbered column respectively. Specifically, the number of piezoelectric devices 20 to be arranged in the piezoelectric sensor may be determined according to wiring space and other factors, and piezoelectric devices 20 may be arranged as many as possible in the case of sufficient wiring space. The specific number of piezoelectric devices 20 is not limited in the embodiment of the present disclosure.

Figure 10:
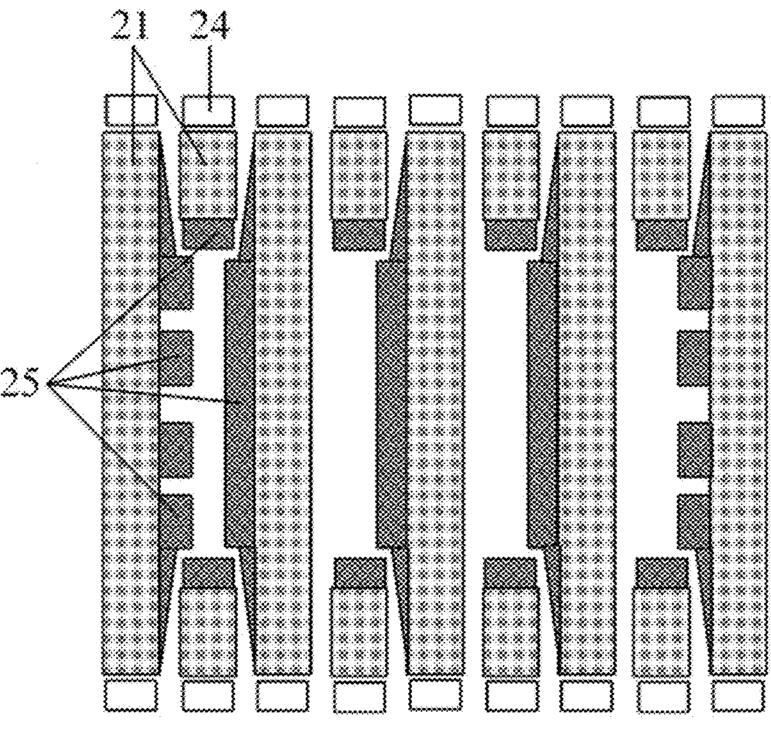
FIG. 10 is a schematic diagram of a planar structure of a first electrode provided by an embodiment of the present disclosure.

During a specific implementation, in the above piezoelectric sensor provided by the embodiment of the present disclosure, as shown in FIG. 4, FIG. 5 and FIG. 10, the piezoelectric sensor further includes: a binding electrode 24 arranged on the same layer as the first electrode 21, where the binding electrode 24 is arranged near an edge of the base substrate 10, the binding electrode 24 is configured to be connected to a drive voltage input end, a voltage signal input from the drive voltage input end is an alternating voltage signal, and the other end of the wire is electrically connected to the binding electrode 24 by means of a third via hole V3 provided on the inorganic insulation layer 40 and the organic insulation layer 30. The piezoelectric sensor further includes: a lead electrode 25 arranged on the same layer as the first electrode 21, where the lead electrode 25 is electrically connected to the first electrode 21, the lead electrode 25 is configured to be connected to an earth voltage input end, and a voltage signal input from the earth voltage input end is an earth voltage signal. During a specific implementation, the earth voltage signal is input to the first electrode 21 by means of the earth voltage input end, and the alternating voltage signal ($V_{AC}$) is loaded to the second electrode 23 by means of the drive voltage input end, such that an alternating electric field may be formed between the first electrode 21 and the second electrode 23, and a frequency of the alternating electric field is identical to that of the alternating voltage signal. Under the action of the alternating electric field, the piezoelectric layer 22 deforms and generates a vibration signal having a frequency identical to that of the alternating electric field. When the frequency of the vibration signal is close to or equal to an inherent frequency of the base substrate 10, the base substrate 10 resonates, the amplitude is enhanced, and a haptic feedback signal is generated. When a finger touches a surface of the base substrate 10, change of friction force may be obviously felt. In practical application, the friction force on the surface of the base substrate 10 may be adjusted by the resonance generated between the piezoelectric layer 22 and the base substrate 10, so as to achieve texture representation of an object on the surface of the base substrate 10.

In this embodiment, the first electrode 21, the binding electrode 24 and the lead electrode 25 may be made of the same material through the same patterning process.

Figure 11:
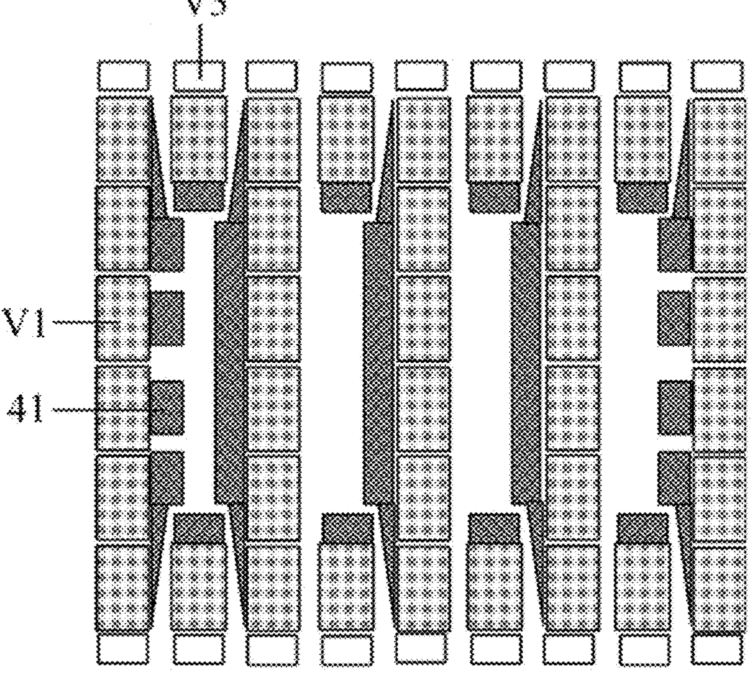
FIG. 11 is a schematic diagram of a planar structure of a removed portion of an insulation layer provided by an embodiment of the present disclosure.

For the inorganic insulation layer 40 and the organic insulation layer 30, after a whole surface is completely coated with insulating materials or insulating materials are deposited on a whole surface, pattern areas shown in FIG. 11 may be removed. The organic insulation layer 30 is arranged to cover a portion of the first electrode 21 to avoid a short circuit with other structures by means of the wiring layer and fill a chamfer of the piezoelectric layer 22. Moreover, a first via hole V1 is provided at the second electrode 23 and a third via hole V3 is provided at the binding electrode 24, such that one end of a wire in the wiring layer is connected to the second electrode 23 by means of the first via hole V1, and the other end of the wiring is connected to the binding electrode 24 by means of the third via hole V3. Moreover, a lead electrode via hole 41 may be provided at the lead electrode 25, such that an external lead and the lead electrode 25 may be connected with silver adhesive or the like.

Figure 12:
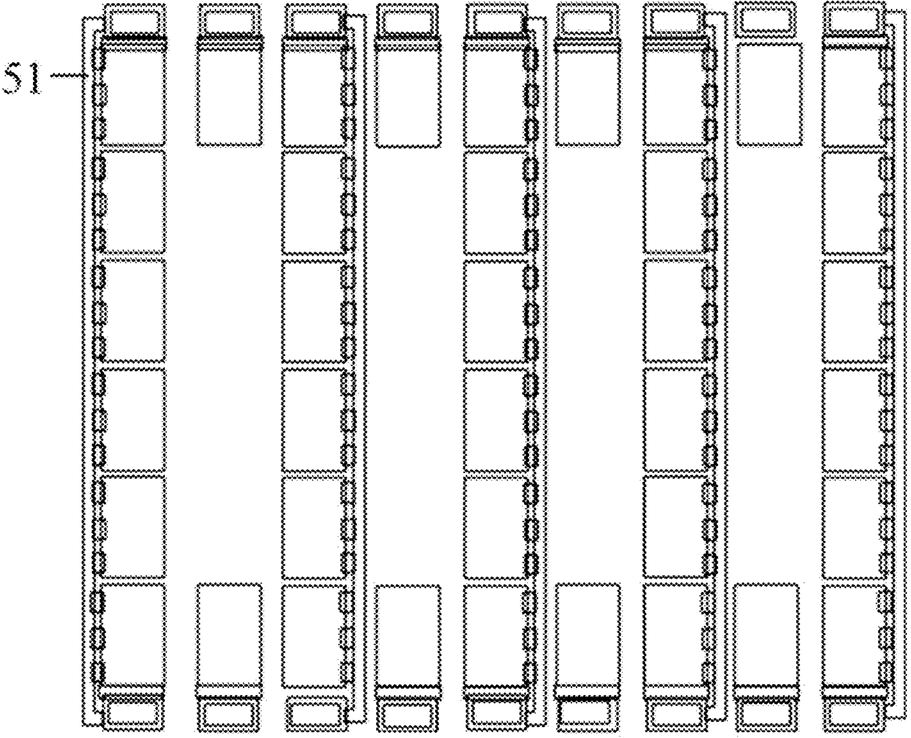
FIG. 12 is a schematic diagram of a planar structure of a wiring layer provided by an embodiment of the present disclosure.

As shown in FIG. 12, a structural schematic diagram of a wiring layer is shown. A wire 51 in the wiring layer 50 is configured to connect a second electrode 23 to a binding electrode 24.

Figure 13:
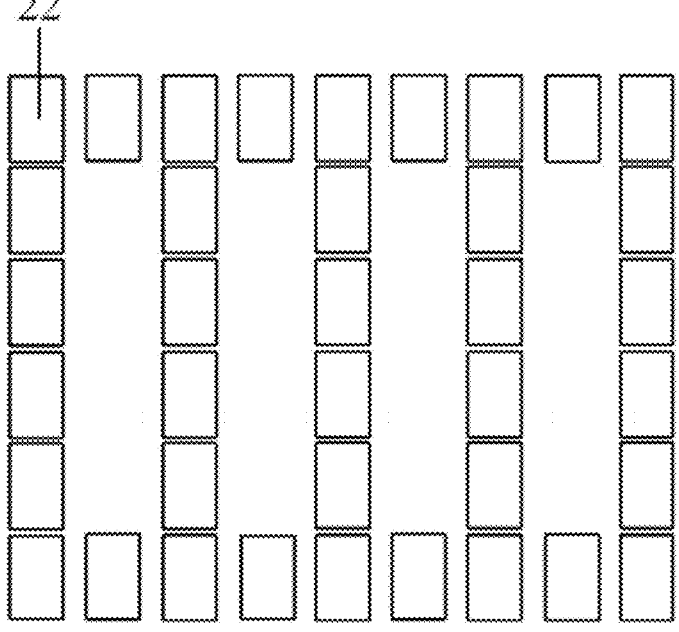
FIG. 13 is a schematic diagram of a planar structure of a piezoelectric layer provided by an embodiment of the present disclosure.
Figure 14:
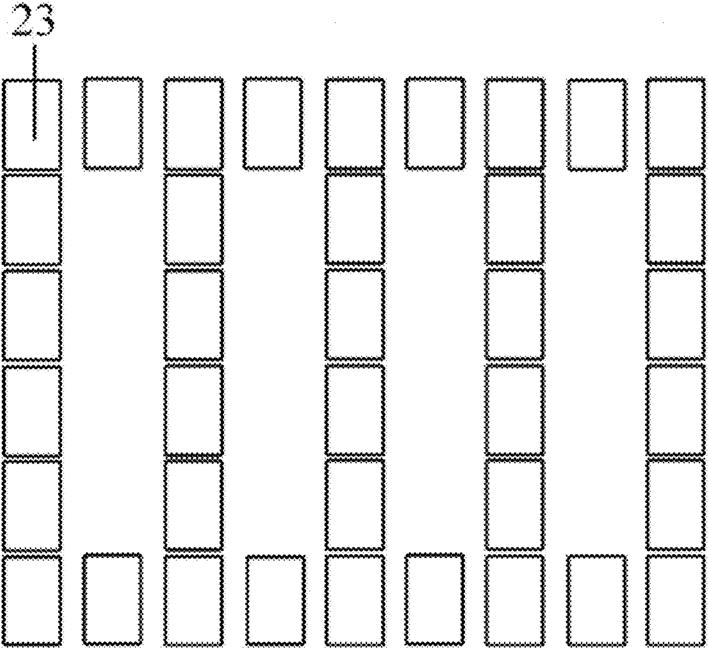
FIG. 14 is a schematic diagram of a planar structure of a second electrode provided by an embodiment of the present disclosure.

It should be noted that first electrodes 21 of all piezoelectric devices 20 may be connected to one another. In this embodiment, in order to reduce parasitic capacitance, first electrodes 21 in the same column are connected to one another, as shown in FIG. 10. Piezoelectric layers 22 of each piezoelectric device 20 may be disconnected from one another and the second electrodes 23 of each piezoelectric device may be disconnected from one another. With reference to FIG. 13 showing a structural schematic diagram of a piezoelectric layer, and with reference to FIG. 14 showing a structural schematic diagram of a second electrode, maintenance may be facilitated. For example, when a certain piezoelectric device 20 has a short circuit, a second electrode 23, at the short circuit, of the piezoelectric device 20 may be isolated to prevent a short-circuited point from affecting other piezoelectric devices 20.

In order to reduce the risk of the short circuit, with reference to FIGS. 4 and 5, an edge of the second electrode 23 may indent relative to an edge of the piezoelectric layer 22. During a specific implementation, indentation of the edge of the second electrode 23 relative to the edge of the piezoelectric layer 22 is greater than or equal to 100 microns and less than or equal to 500 microns. For example, the indentation may be 150 microns.

To further reduce the risk of the short circuit, the edge of the piezoelectric layer 22 may indent relative to the edge of the first electrode 21.

Figure 15:
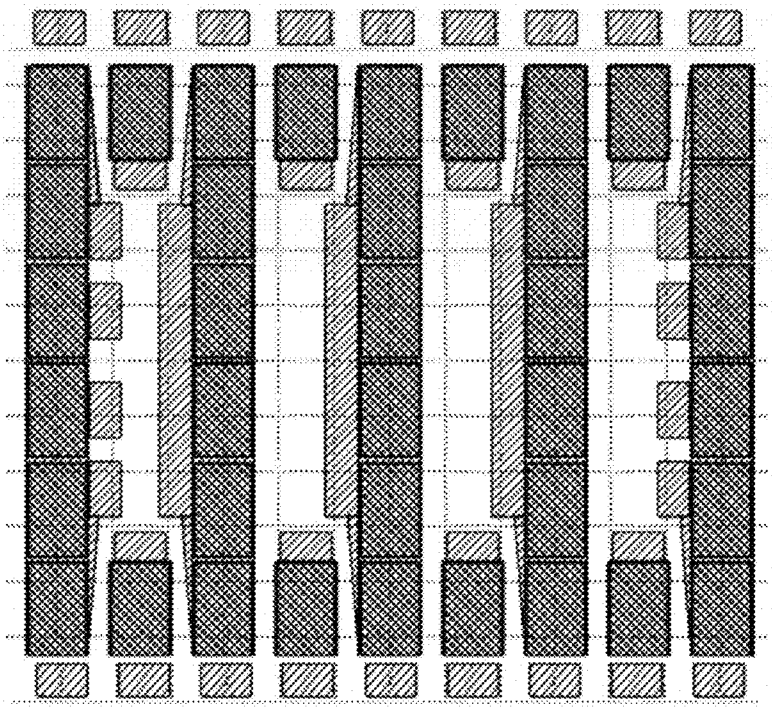
FIG. 15 is a schematic diagram of a planar structure of a prepared piezoelectric layer according to an embodiment of the present disclosure.
Figure 16:
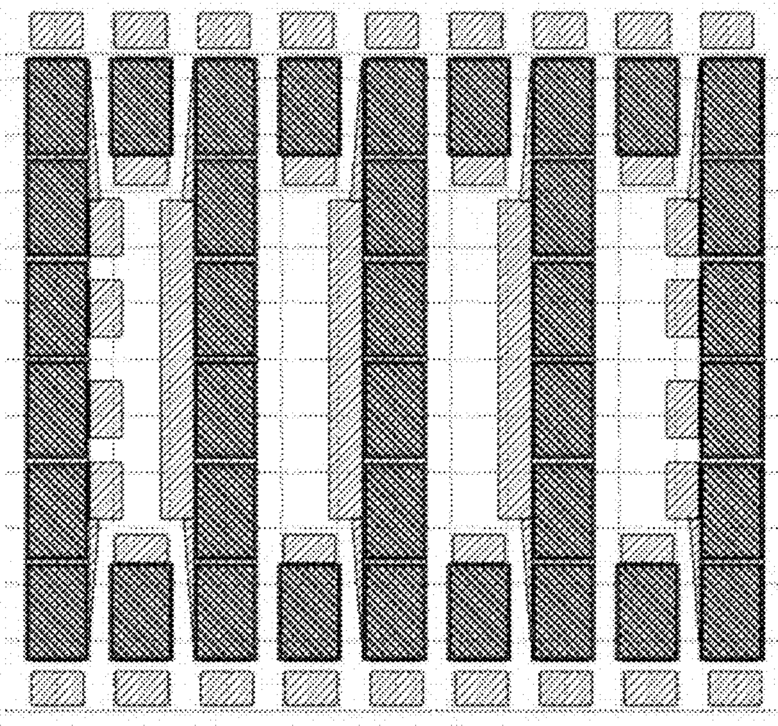
FIG. 16 is a schematic diagram of a planar structure of a prepared second electrode provided by an embodiment of the present disclosure.
Figure 17:
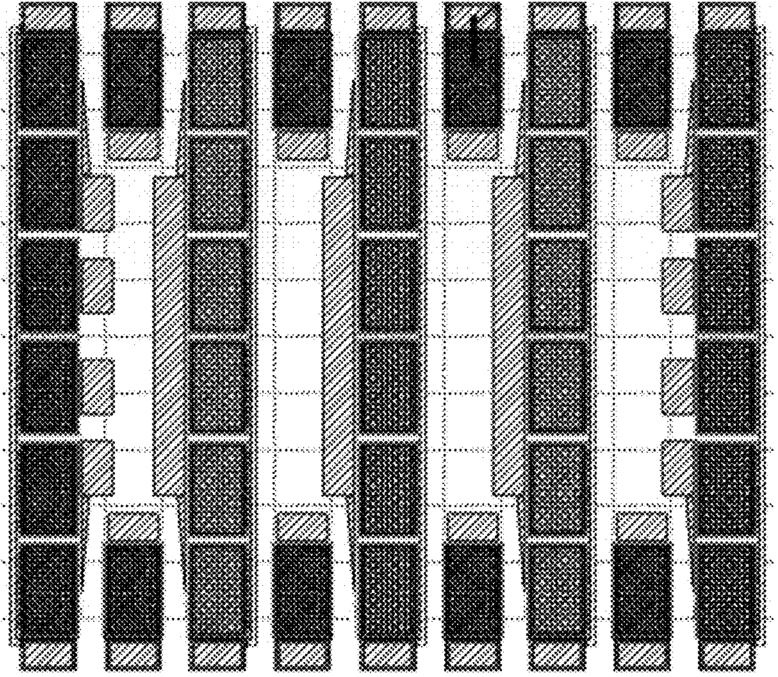
FIG. 17 is a schematic diagram of a planar structure of a prepared wiring layer provided by an embodiment of the present disclosure.

During actual preparation process, the first electrode 21, the piezoelectric layer 22, the second electrode 23, an organic insulation layer 30, an inorganic insulation layer 40 and a wiring layer 50 may be sequentially formed on the base substrate 10. With reference to FIG. 10, a schematic diagram of a planar structure of a prepared first electrode is shown, with reference to FIG. 15, a schematic diagram of a planar structure of a prepared piezoelectric layer is shown, with reference to FIG. 16, a schematic diagram of a planar structure of a prepared second electrode is shown, and with reference to FIG. 17, a schematic diagram of a planar structure of a prepared wiring layer is shown. A structural schematic structure of a section at a bold black line in FIG. 17 is shown in FIG. 1.

In an alternative implementation, as shown in FIG. 9, the first electrodes 21 of the piezoelectric devices 20 in the same column are connected to one another (as shown in FIG. 10), and the second electrodes 23 of the piezoelectric devices 20 in the same column are all connected to the same wire 51 of the wiring layer 50 (as shown in FIG. 12), that is, the second electrodes 23 of the piezoelectric devices 20 in the same column are connected to one another by means of the same wire 51 of the wiring layer 50. In this way, the piezoelectric devices 20 with the first electrodes 21 in the same column connected to one another and the second electrodes 23 in the same column connected to one another may be driven as a whole, thus achieving column drive. It should be noted that when the piezoelectric devices 20 on the piezoelectric sensor needs to be driven as a whole, all the second electrodes 23 may be connected to one another by means of wires in the wiring layer 50.

During a specific implementation, in the above piezoelectric sensor provided by the embodiment of the present disclosure, the wiring layer may be made of Ti/Ni/Au, where Ti may be 10 nm, Ni may be 400 nm, and Au may be 100 nm; alternatively, the wiring layer may be made of Ti/Au, where Ti may be 10 nm and Au may be 400 nm; and alternatively, the wiring layer may be made of Ti/Al/Ti, where Ti may be 10 nm and Al may be 300 nm.

During a specific implementation, in the above piezoelectric sensor provided by the embodiment of the present disclosure, as shown in FIG. 4, FIG. 5, FIG. 7 and FIG. 8, the inorganic insulation layer 40 may has a thickness within 100 nm-300 nm, for example, the inorganic insulation layer 40 may has a thickness of 100 nm, 200 nm or 300 nm.

The piezoelectric sensor provided by the embodiment of the present disclosure may be applied to the fields of medical treatment, automotive electronics, motion tracking systems, etc., especially suitable for the field of wearable devices, monitoring and treatment outside medical treatment or implanted in the human body, or applied to the fields of artificial intelligence electronic skin, etc. Specifically, the piezoelectric sensor may be applied to apparatuses that may produce vibration and mechanical properties, such as brake pads, keyboards, mobile terminals, gamepads, and on-board apparatuses.

Figure 18:
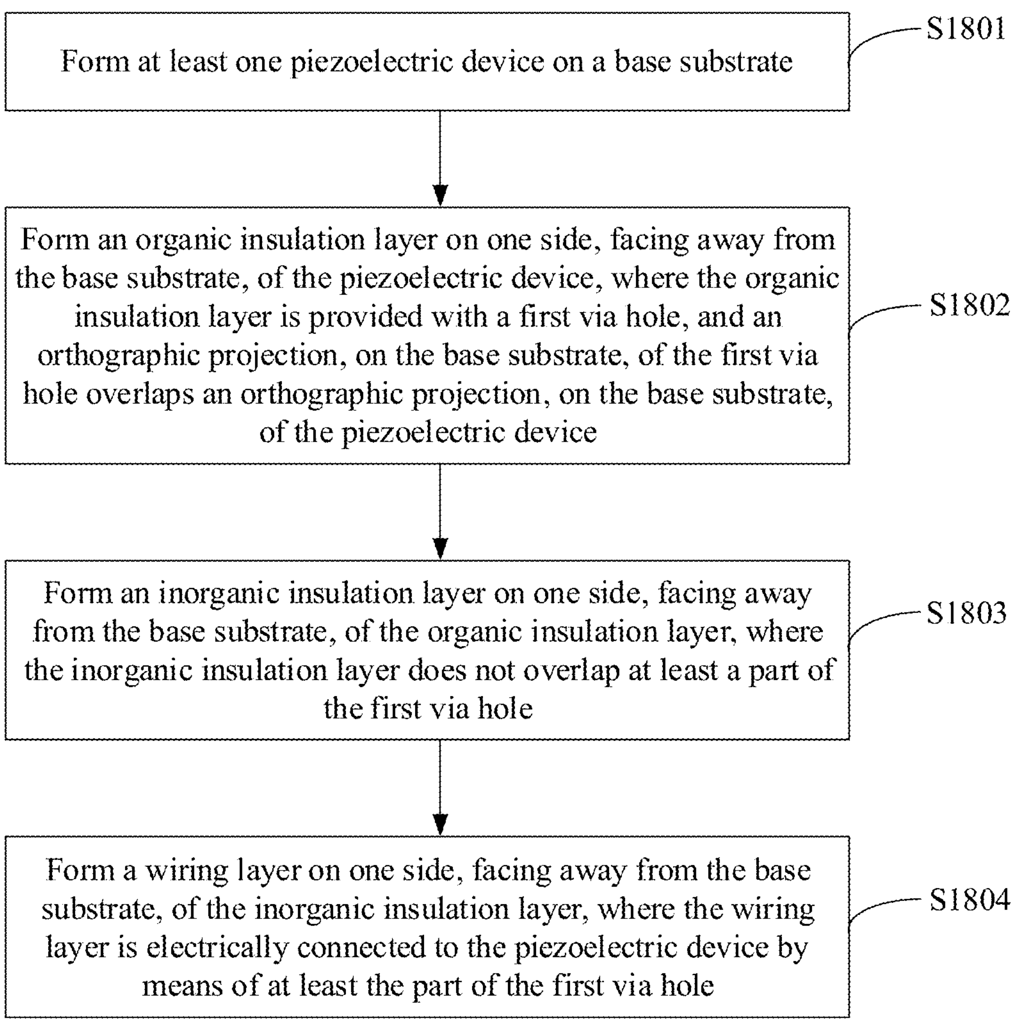
FIG. 18 is a flowchart of a method for manufacturing a piezoelectric sensor provided by an embodiment of the present disclosure.

Based on the same inventive concept, the embodiment of the present disclosure also provides a method for manufacturing a piezoelectric sensor, as shown in FIG. 18. The method includes: S1801 to S1804.

S1801, form at least one piezoelectric device on a base substrate.

S1802, form an organic insulation layer on one side, facing away from the base substrate of the piezoelectric device. The organic insulation layer is provided with a first via hole, and an orthographic projection, on the base substrate, of the first via hole overlaps an orthographic projection, on the base substrate, of the piezoelectric device.

S1803: form an inorganic insulation layer on one side, facing away from the base substrate, of the organic insulation layer, where the inorganic insulation layer does not overlap at least a portion of the first via hole.

S1804: form a wiring layer on one side, facing away from the base substrate, of the inorganic insulation layer, where the wiring layer is electrically connected to the piezoelectric device by means of at least the portion of the first via hole.

According to the method for manufacturing the piezoelectric sensor provided by the above embodiment of the present disclosure, the inorganic insulation layer is arranged between the wiring layer and the organic insulation layer. Since adhesion between the inorganic insulation layer and the wiring layer is strong, the inorganic insulation layer may solve the problem of poor adhesion between the organic insulation layer and the wiring layer on the basis that the organic insulation layer solves the problem of a chamfer of the piezoelectric layer of the piezoelectric device, thereby preventing the wiring layer from peeling and further preventing the wiring layer from burning out or generating high heat under the voltage drive.

Figure 19:
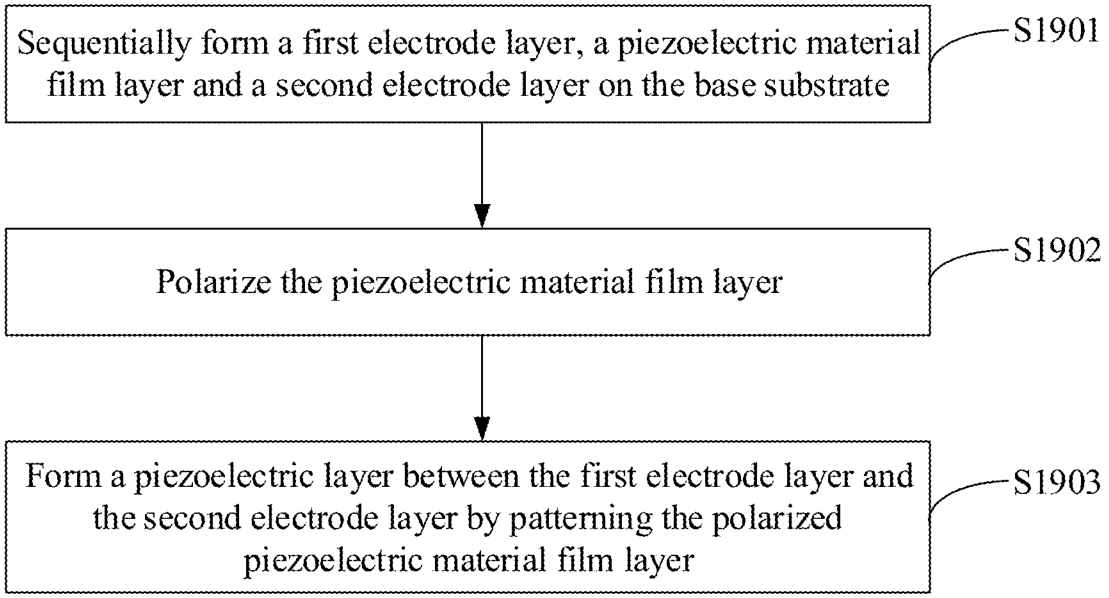
FIG. 19 is a flowchart of a method for manufacturing a piezoelectric device provided by an embodiment of the present disclosure.

During a specific implementation, in the method for manufacturing the piezoelectric sensor provided by the embodiment of the present disclosure, as shown in FIG. 19, the forming a piezoelectric device specifically includes: S1901 to S1903.

S1901, sequentially form a first electrode, a piezoelectric material film layer and a second electrode on the base substrate.

Specifically, a plurality of patterned first electrodes may be arranged, or the first electrodes may be in a whole surface structure. A plurality of patterned second electrodes may be arranged.

S1902, polarize the piezoelectric material film layer.

Specifically, a strong direct current electric field is applied to the piezoelectric material film layer, such that electric domains in the piezoelectric material film layer are arranged in a direction of an electric field.

S1903, form a piezoelectric layer between the first electrode and the second electrode by patterning the polarized piezoelectric material film layer.

Specifically, the patterned piezoelectric layer may be formed in a method of dry coating (Sputter) or wet coating (Sol-Gel).

Based on the same inventive concept, an embodiment of the present disclosure further provides a haptic feedback apparatus. The haptic feedback apparatus includes the above piezoelectric sensor provided by the embodiment of the present disclosure. Since a principle of solving problems of the haptic feedback apparatus is similar to that of the aforementioned piezoelectric sensor, reference may be made to implementation of the aforementioned piezoelectric sensor for implementation of the haptic feedback apparatus, and overlaps are not repeated herein. The haptic feedback apparatus may be any product or component with a display or touch function, such as mobile phones, tablet computers, televisions, displays, notebook computers, digital photo frames and navigators.

During a specific implementation, the above haptic feedback apparatus provided by the embodiment of the present disclosure may further include other functional structures well known to those skilled in the art, which will not be described in detail herein.

During a specific implementation, the haptic feedback apparatus may be combined with the touch screen, and a touch position of the human body may be determined by the touch screen, such that a corresponding vibration waveform, amplitude and frequency may be generated, and human-computer interaction may be achieved. For example, a touch control position of the human body is determined by the piezoelectric sensor in the haptic feedback apparatus, and a corresponding vibration waveform, amplitude and frequency are generated, such that human-computer interaction may be achieved. It is certain that the haptic feedback apparatus may also be applied to medical treatment, automotive electronics, motion tracking systems and other fields according to actual needs, which will not be described in detail herein.

According to the piezoelectric sensor and the haptic feedback apparatus provided by the above embodiment of the present disclosure, the inorganic insulation layer is arranged between the wiring layer and the organic insulation layer. Since adhesion between the inorganic insulation layer and the wiring layer is strong, the inorganic insulation layer may solve the problem of poor adhesion between the organic insulation layer and the wiring layer on the basis that the organic insulation layer solves the problem of a chamfer of the piezoelectric layer of the piezoelectric device, thereby preventing the wiring layer from peeling and further preventing the wiring layer from burning out or generating high heat under the voltage drive.

Although the preferred embodiments of the present disclosure have been described, a person of ordinary skill in the art may make additional changes and modifications to these embodiments once they learn the basic inventive concept. Therefore, the appended claims are intended to be interpreted as including the preferred embodiments and all changes and modifications falling within the scope of the present disclosure.

Apparently, a person of ordinary skill in the art may make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent technologies, the present disclosure is also intended to include these modifications and variations.

What is claimed is:

1. A piezoelectric sensor, comprising:

a base substrate;

at least one piezoelectric device located on the base substrate;

an organic insulation layer located on one side, facing away from the base substrate, of the piezoelectric device, wherein the organic insulation layer is provided with a first via hole, and an orthographic projection, on the base substrate, of the first via hole overlaps an orthographic projection, on the base substrate, of the piezoelectric device;

an inorganic insulation layer located on one side, facing away from the base substrate, of the organic insulation layer, wherein the inorganic insulation layer does not overlap at least a portion of the first via hole; and a wiring layer located on one side, facing away from the base substrate, of the inorganic insulation layer, wherein the wiring layer comprises a wire, one end of the wire being electrically connected to the piezoelectric device by means of at least the portion of the first via hole;

wherein the piezoelectric device comprises: a first electrode between the base substrate and the organic insulation layer, a piezoelectric layer between the first electrode and the organic insulation layer, and a second electrode between the piezoelectric layer and the organic insulation layer; wherein the inorganic insulation layer covers a side wall of the first via hole and the second electrode exposed out of the first via hole, a portion, covering the second electrode, of the inorganic insulation layer is provided with at least one second via hole, and the wiring layer is electrically connected to the second electrode by means of the first via hole and the second via hole.

2. The piezoelectric sensor according to claim 1, wherein at a same side wall of the first via hole, a contact boundary between the inorganic insulation layer and the second electrode is a first boundary, a contact boundary between the organic insulation layer and the second electrode is a second boundary, and a distance between the first boundary and the second boundary is greater than 30% and less than 60% of a thickness of the piezoelectric layer.

3. The piezoelectric sensor according to claim 1, further comprising: a binding electrode arranged on the same layer as the first electrode, wherein the binding electrode is arranged near an edge of the base substrate, the binding electrode is configured to be connected to a drive voltage input end, and a voltage signal input from the drive voltage input end is an alternating voltage signal; an-other end of the wire is electrically connected to the binding electrode by means of a third via hole provided on the inorganic insulation layer and the organic insulation layer; and the piezoelectric sensor further comprises: a lead electrode arranged on the same layer as the first electrode, wherein the lead electrode is electrically connected to the first electrode, the lead electrode is configured to be connected to an earth voltage input end, and a voltage signal input from the earth voltage input end is an earth voltage signal.

4. The piezoelectric sensor according to claim 3, wherein the piezoelectric sensor comprises multiple piezoelectric devices, the multiple piezoelectric devices are arrayed on one side of the base substrate, first electrodes of piezoelectric devices in the same column are in communication with one another, and second electrodes of the piezoelectric devices in the same column are all connected to the same wire of the wiring layer.

5. The piezoelectric sensor according to claim 1, wherein the piezoelectric sensor comprises one inorganic insulation layer.

6. The piezoelectric sensor according to claim 5, wherein a material of the inorganic insulation layer is made of one of $SiO_2$, $Al_2O_3$ and $Si_3N_4$.

7. The piezoelectric sensor according to claim 1, wherein the inorganic insulation layer comprises at least two sub-layers that are stacked, and the two sub-layers are made of different materials.

8. The piezoelectric sensor according to claim 7, wherein materials of the sub-layers are made of one of $SiO_2$, $Al_2O_3$ and $Si_3N_4$.

9. The piezoelectric sensor according to claim 1, wherein the wiring layer is in a grid structure in shape, and a material of the wiring layer is made of one of Ti/Ni/Au, Ti/Au and Ti/Al/Ti.

10. The piezoelectric sensor according to claim 1, wherein a thickness of the inorganic insulation layer ranges from 100 nm to 300 nm.

11. The piezoelectric sensor according to claim 1, wherein a thickness of the piezoelectric layer ranges from 500 nm to 2000 nm.

12. The piezoelectric sensor according to claim 1, wherein the piezoelectric layer comprises at least one of lead zirconate titanate, aluminum nitride, zinc oxide, barium titanate, lead titanate, potassium niobate, lithium niobate, lithium tantalate and lanthanum gallium silicate.

13. A haptic feedback apparatus, comprising a piezoelectric sensor, wherein the piezoelectric sensor comprises:

a base substrate;

at least one piezoelectric device located on the base substrate;

an organic insulation layer located on one side, facing away from the base substrate, of the piezoelectric device, wherein the organic insulation layer is provided with a first via hole, and an orthographic projection, on the base substrate, of the first via hole overlaps an orthographic projection, on the base substrate, of the piezoelectric device;

an inorganic insulation layer located on one side, facing away from the base substrate, of the organic insulation layer, wherein the inorganic insulation layer does not overlap at least a portion of the first via hole; and a wiring layer located on one side, facing away from the base substrate, of the inorganic insulation layer, wherein the wiring layer comprises a wire, one end of the wire being electrically connected to the piezoelectric device by means of at least the portion of the first via hole;

wherein the piezoelectric device comprises: a first electrode between the base substrate and the organic insulation layer, a piezoelectric layer between the first electrode and the organic insulation layer, and a second electrode between the piezoelectric layer and the organic insulation layer; wherein the inorganic insulation layer covers a side wall of the first via hole and the second electrode exposed out of the first via hole, a portion, covering the second electrode, of the inorganic insulation layer is provided with at least one second via hole, and the wiring layer is electrically connected to the second electrode by means of the first via hole and the second via hole.

14. The haptic feedback apparatus according to claim 13, wherein at a same side wall of the first via hole, a contact boundary between the inorganic insulation layer and the second electrode is a first boundary, a contact boundary between the organic insulation layer and the second electrode is a second boundary, and a distance between the first boundary and the second boundary is greater than 30% and less than 60% of a thickness of the piezoelectric layer.

15. The haptic feedback apparatus according to claim 13, wherein the piezoelectric sensor further comprises:

a binding electrode arranged on the same layer as the first electrode, wherein the binding electrode is arranged near an edge of the base substrate, the binding electrode is configured to be connected to a drive voltage input end, and a voltage signal input from the drive voltage input end is an alternating voltage signal; an other end of the wire is electrically connected to the binding electrode by means of a third via hole provided on the inorganic insulation layer and the organic insulation layer; and the piezoelectric sensor further comprises: a lead electrode arranged on the same layer as the first electrode, wherein the lead electrode is electrically connected to the first electrode, the lead electrode is configured to be connected to an earth voltage input end, and a voltage signal input from the earth voltage input end is an earth voltage signal.

16. The haptic feedback apparatus according to claim 15, wherein the piezoelectric sensor comprises multiple piezoelectric devices, the multiple piezoelectric devices are arrayed on one side of the base substrate, first electrodes of piezoelectric devices in the same column are in communication with one another, and second electrodes of the piezoelectric devices in the same column are all connected to the same wire of the wiring layer.

17. A piezoelectric sensor, comprising:

a base substrate;

at least one piezoelectric device located on the base substrate;

an organic insulation layer located on one side, facing away from the base substrate, of the piezoelectric device, wherein the organic insulation layer is provided with a first via hole, and an orthographic projection, on the base substrate, of the first via hole overlaps an orthographic projection, on the base substrate, of the piezoelectric device;

an inorganic insulation layer located on one side, facing away from the base substrate, of the organic insulation layer, wherein the inorganic insulation layer does not overlap at least a portion of the first via hole; and a wiring layer located on one side, facing away from the base substrate, of the inorganic insulation layer, wherein the wiring layer comprises a wire, one end of the wire being electrically connected to the piezoelectric device by means of at least the portion of the first via hole;

wherein the piezoelectric device comprises: a first electrode between the base substrate and the organic insulation layer, a piezoelectric layer between the first electrode and the organic insulation layer, and a second electrode between the piezoelectric layer and the organic insulation layer;

the piezoelectric sensor further comprises: a binding electrode arranged on the same layer as the first electrode, wherein the binding electrode is arranged near an edge of the base substrate, the binding electrode is configured to be connected to a drive voltage input end, and a voltage signal input from the drive voltage input end is an alternating voltage signal; another end of the wire is electrically connected to the binding electrode by means of a third via hole provided on the inorganic insulation layer and the organic insulation layer; and the piezoelectric sensor further comprises: a lead electrode arranged on the same layer as the first electrode, wherein the lead electrode is electrically connected to the first electrode, the lead electrode is configured to be connected to an earth voltage input end, and a voltage signal input from the earth voltage input end is an earth voltage signal.

18. The piezoelectric sensor according to claim 17, wherein at a same side wall of the first via hole, a contact boundary between the inorganic insulation layer and the second electrode is a first boundary, a contact boundary between the organic insulation layer and the second electrode is a second boundary, and a distance between the first boundary and the second boundary is greater than 30% and less than 60% of a thickness of the piezoelectric layer.

19. The piezoelectric sensor according to claim 17, wherein the piezoelectric sensor comprises multiple piezoelectric devices, the multiple piezoelectric devices are arrayed on one side of the base substrate, first electrodes of piezoelectric devices in the same column are in communication with one another, and second electrodes of the piezoelectric devices in the same column are all connected to the same wire of the wiring layer.

20. The piezoelectric sensor according to claim 17, wherein the wiring layer is in a grid structure in shape, and a material of the wiring layer is made of one of Ti/Ni/Au, Ti/Au and Ti/Al/Ti.

* * * * *